United States Patent
Kimura

(10) Patent No.: US 6,800,508 B2
(45) Date of Patent: Oct. 5, 2004

(54) SEMICONDUCTOR DEVICE, ITS MANUFACTURING METHOD AND ELECTRODEPOSITION FRAME

(75) Inventor: Hiroshi Kimura, Tokyo (JP)

(73) Assignee: Torex Semiconductor Ltd, Okayama (JP)

( * ) Notice: Subject to any disclaimer, the term of this patent is extended or adjusted under 35 U.S.C. 154(b) by 0 days.

(21) Appl. No.: 09/837,022

(22) Filed: Apr. 18, 2001

(65) Prior Publication Data

US 2001/0033018 A1 Oct. 25, 2001

(30) Foreign Application Priority Data

Apr. 25, 2000 (JP) .......................................... 2000-124102
Mar. 19, 2001 (JP) .......................................... 2001-078791

(51) Int. Cl.[7] .......................... H01L 21/66; H01L 21/00; H01L 21/44; H01L 23/495
(52) U.S. Cl. .......................... 438/123; 438/15; 438/25; 438/51; 438/55; 438/64; 438/111; 438/124; 257/666
(58) Field of Search .......................... 257/666, 784, 257/787; 438/15, 64, 25, 124, 111, 123, 55, 51, 106, 117, 112, 126, 107, 110, 127, 113, 121, 461, 459, 464, 689, 477, FOR 100, FOR 106

(56) References Cited

U.S. PATENT DOCUMENTS

| | | | | |
|---|---|---|---|---|
| 633,252 A | * | 9/1899 | Venezia | 52/382 |
| 3,698,076 A | * | 10/1972 | Kingsley | 228/180.21 |
| 4,033,833 A | * | 7/1977 | Bestel et al. | 205/104 |
| 5,900,676 A | * | 5/1999 | Kweon et al. | 257/787 |
| 5,909,053 A | * | 6/1999 | Fukase et al. | 257/666 |
| 6,001,671 A | * | 12/1999 | Fjelstad | 438/110 |
| 6,166,430 A | * | 12/2000 | Yamaguchi | 257/666 |
| 6,191,494 B1 | * | 2/2001 | Ooyama et al. | 257/675 |
| 6,211,462 B1 | * | 4/2001 | Carter et al. | 174/52.4 |
| 6,247,229 B1 | * | 6/2001 | Glenn | 29/841 |
| 6,333,252 B1 | * | 12/2001 | Jung et al. | 438/612 |
| 6,365,980 B1 | * | 4/2002 | Carter et al. | 257/787 |
| 6,380,062 B1 | * | 4/2002 | Liu | 438/613 |
| 2002/0100165 A1 | * | 8/2002 | Glenn | 29/841 |
| 2002/0197256 A1 | * | 12/2002 | Grewal | 424/144.1 |

FOREIGN PATENT DOCUMENTS

| | | | |
|---|---|---|---|
| JP | 03-108745 | * | 8/1991 |
| JP | 06188349 | * | 7/1994 |
| JP | 409148508 | * | 6/1997 |
| JP | 2001-24001 | * | 1/2001 |

* cited by examiner

*Primary Examiner*—Kamand Cuneo
*Assistant Examiner*—James Mitchell
(74) *Attorney, Agent, or Firm*—Butzel Long

(57) ABSTRACT

A semiconductor device includes: a semiconductor element 2 bonded on a first metallic layer; a wire 4 for electrically connecting an electrode pad of the semiconductor element to a second metallic layer; and a resin package 7 for sealing said semiconductor element. Rear surfaces of the first metallic layer 8a and the second metallic layer 8b are flush with a bottom of said resin package.

4 Claims, 5 Drawing Sheets

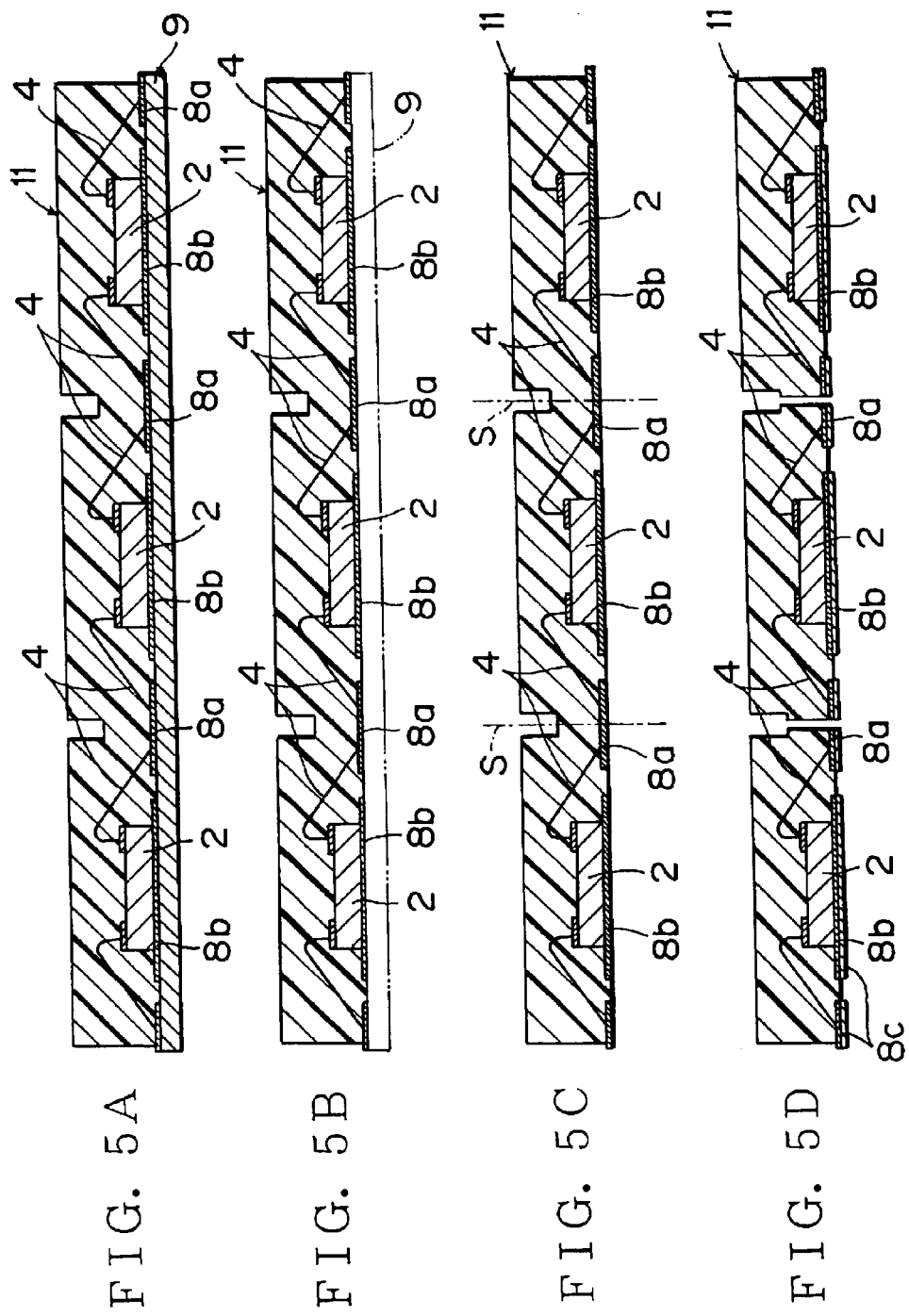

SEMICONDUCTOR DEVICE, ITS MANUFACTURING METHOD AND ELECTRODEPOSITION FRAME

BACKGROUND OF THE INVENTION

1. Field of the Invention

This invention relates to a semiconductor device, its manufacturing method and an electrodeposition frame, and more particularly to a leadless surface-mounted resin-sealed semiconductor device, its manufacturing method and an electrodeposition frame on which a semiconductor device is mounted.

2. Description of the Related Art

FIG. 8 is a sectional view showing a conventional semiconductor device which is a leadless surface-mounted resin-sealed semiconductor device.

As seen from FIG. 8, metallic layers $3_1$ and $3_2$ are formed on the front surface of a glass epoxy substrate (or ceramic substrate), whereas an electrode metallic layer $5a$ is formed on the rear surface thereof so as to correspond to the metallic layer $3_2$. The metallic layer $3_2$ and the electrode metallic layer $5a$ are electrically conceited to each other via through-holes 6.

A semiconductor element 2 is bonded onto the metallic layer $3_1$ of the glass epoxy substrate 1: Electrode pads $2a$ of the semiconductor element 2 and the metallic layer $3_2$ are electrically connected by wirings 4. The semiconductor element with the wirings is resin-sealed by epoxy resin 7.

In the conventional leadless surface-mounted type semiconductor device, as shown in FIG. 8, a large number of through-holes 6 are formed on the glass epoxy substrate 1, a large number of metallic layers $3_1$ are formed on the glass epoxy substrate 1, and the semiconductor element 2 is bonded to each of the metallic layers $3_1$. The electrode pads $2a$ of the semiconductor element are connected to the metallic layers $3_2$ via the wirings 4.

In a process of manufacturing a semiconductor device, semiconductor elements which are located in several hundreds on a single glass epoxy substrate are wire-bonded and resin-sealed.

Therefore, in the semiconductor device having a such a structure, the number of through-holes 6 is several times as large as that of the semiconductor elements 2 so that the number of man-hours for forming the through-holes cannot be disregarded. This has been a cause of increasing the production cost of such a semiconductor device.

Further, in the leadless surface-mounted type semiconductor device, in order to form a through-hole in a gap between the adjacent semiconductor elements, an area where the through-hole is to be formed must be prepared in the gap. Therefore, the actual number of the semiconductor elements which can be mounted in the single glass epoxy substrate is limited. This also has been a cause of increasing the production cost.

Furthermore, in the conventional leadless surface-mounted semiconductor device, the semiconductor devices mounted on the glass epoxy substrate are resin-sealed. Therefore, heat generated when the semiconductor element operates is not dissipated but stored in the glass epoxy substrate. Namely, the conventional leadless surface-mounted semiconductor device has poor heat dissipation.

SUMMARY OF THE INVENTION

This invention has been accomplished in order to obviate the inconveniences described above.

A first object of this invention is to provide a leadless surface-mounted semiconductor device which can be manufactured at low cost and provides improved heat dissipation.

A second object of this invention is to provide a method of manufacturing such a semiconductor device.

In order to attain the first object, semiconductor device comprising:

a semiconductor element bonded on a first metallic layer;

a wire for electrically connecting an electrode pad of the semiconductor element to a second metallic layer; and a resin package for sealing the semiconductor element, wherein rear surfaces of the first metallic layer and the second metallic layer are flush with a bottom of the resin package.

This configuration provides a leadless semiconductor device in which the semiconductor element sealed within the resin package is mounted on the metallic film exposed from the bottom of the resin package and the metallic layer for external extension is exposed from the bottom of the resin package. In this configuration, a glass epoxy substrate or a ceramic substrate is not employed. Therefore, the semiconductor device can be made low in height so that good heat dissipation from the semiconductor element can be given. Since the above metallic layers are thin films, the leadless semiconductor device with good conductivity can be provided as compared with the semiconductor device using leads.

Since the semiconductor device does not require an expensive substrate, it can be manufactured at relatively low cost. In addition, since the metallic layers and the resin package are flush with each other on the rear surface of the semiconductor substrate, when the semiconductor device is mounted on a circuit board, it can be brought into intimate contact with the circuit board. Further, heat generated from the semiconductor elements can be easily dissipated through the circuit board. A very thin flat electrode metallic layer may be deposited on the rear surface of the metallic layer for external extension as occasion demands.

Preferably, the first metallic layer on which the semiconductor element is placed has a larger area than that of a bottom surface of the semiconductor element.

This configuration provides a sufficient creepage distance from the surface of the resin package to the semiconductor element, thus improving humidity resistance of the semiconductor element.

Preferably, the first metallic layer is thicker than the second metallic layer, and the first metallic layer has a smaller area than a bottom area of the semiconductor element.

In this configuration, since the metallic layer on which the semiconductor element is placed is thicker, a sufficient creepage distance from the bottom of the resin package to the semiconductor element can be given so that the semiconductor device is given improved humidity resistance, and the semiconductor element having a relatively large size can be resin sealed.

Further, since the metallic layer on which semiconductor element is placed is made thicker, the semiconductor element can be arranged centrally within the resin package. For this reason, even when the semiconductor device suffers from thermal stress, the resin package is difficult to rupture.

Preferably, the second metallic layer for external extension is individually exposed from a bottom of the resin package.

In this configuration, the second metallic layer can take any optional shape. It is needless to say that the second metallic layer is made integral.

In accordance with another aspect of this invention, there is provided a method of manufacturing a semiconductor device comprising the steps of:

forming an electrodeposition frame on a flexible flat metallic substrate, the electrodeposition frame with first metallic layers and second metallic layers for external extension being patterned;

contiguously mounting a plurality of semiconductor elements each with electrode pads thereon, on the first metallic layers, respectively;

wire-bonding the electrode pads to the second metallic layers which are located between the semiconductor elements;

resin-sealing the semiconductor elements mounted on the electrodeposition frame;

removing the metallic substrate to provide a resin sealing body; and cutting the resin sealing body into individual semiconductor devices with the air of cutting marks formed the first and second metallic layers.

This provides a method of manufacturing a semiconductor device using a flexible flat metallic substrate but not a substrate similar to the glass epoxy resin. By removing the flexible flat metallic substrate of the electrodeposition frame, the resin sealing body with a large number of semiconductor elements resin-sealed can be formed. Since the metallic substrate is flexible, when the metallic substrate is removed from the resin sealing body, the resin sealing body is difficult to suffer from stress.

The above manufacturing method, after the step of cutting, preferably includes the step of:

depositing metallic layers for electrodes to the second metallic layers exposed from a rear surface of the resin sealing body.

Since the metallic layers can be deposited to have a very small thickness by electrolytic or non-electrolytic plating as occasion demands, they are brought into intimate contact with the circuit board.

In the step of cutting of the resin sealing body, it is cut along a center line of each of the second metallic layers to provide metallic layers for external extension for adjacent semiconductor elements.

In this step, since the adjacent semiconductor devices can be mounted contiguously on the metallic substrate, the semiconductor elements can be densely arranged on the metallic substrate.

Preferably, the electrodeposition frame is resin sealed together with the semiconductor elements using the metallic substrate as a lower die. In this configuration, the metallic layers can be formed independently in the electrodeposition frame.

The above and other objects and features of this invention will be more apparent from the following description taken in conjunction with the accompanying drawings.

BRIEF DESCRIPTION OF THE DRAWINGS

FIGS. 5A to 5D are sectional views showing respective steps successive to the step of FIG. 4E in the embodiment of a method of manufacturing a semiconductor device according to this invention;

DESCRIPTION OF THE PREFERRED EMBODIMENTS

Figure 1A:
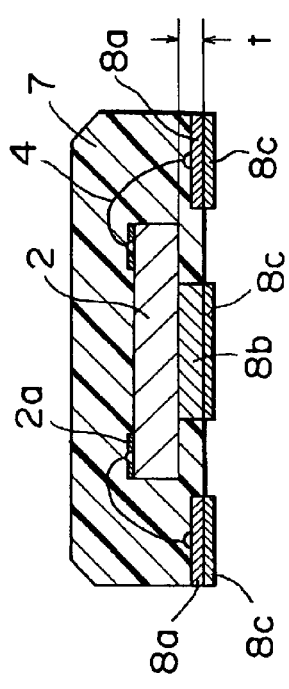
FIGS. 1A and 1B are a sectional view of an embodiment of the semiconductor device according to this invention and a bottom view thereof.

Now referring to the drawings, an explanation will be given of various embodiments of a semiconductor device according to this invention, a manufacturing method and an electrodeposition frame used therein. A concrete explanation will be given of a resin-sealed leadless surface-mounted semiconductor device to which this invention is directed.

Figure 1B:
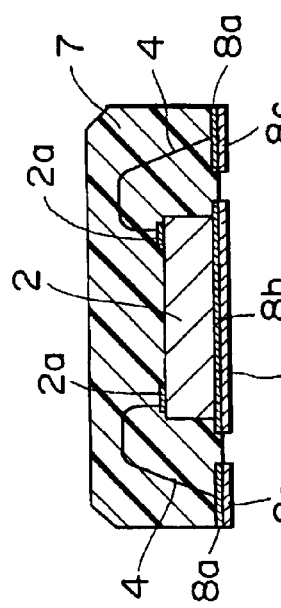

FIGS. 1A and 1B are a sectional view of an embodiment of a leadless surface-mounted semiconductor device according to this invention and a bottom view thereof. In these figures, reference numeral 2 denotes a semiconductor element with electrode pads formed thereon. Reference numeral 7 denotes a resin package for sealing the semiconductor element 2. The electrode pads 2a of the semiconductor element 2 are electrically connected to metallic layers 8a for external extension by means of wirings 4.

The semiconductor element 2 is bonded to a metallic layer 8b. The area of the metallic layer 8b is wider than that of the bottom of the semiconductor element 2. The semiconductor element 2 is bonded centrally to the metallic layer 8b. The area of the bottom of the semiconductor element 2 is smaller than that of the metallic layer 8b so that a sufficient creepage distance is provided between the semiconductor element 2 and the bottom of the resin package 7.

The bottom of the metallic layers 8a and 8b is exposed from the resin package 7. The externally exposed planes of the metallic layers 8a and 8b are flush with the bottom surface of the resin package 7. Flat thin-film metallic layers 8c are formed on the bottom surfaces of the metallic layers 8a and 8b.

The metallic layers 8a and 8 each is composed of a Ni or Ni—Co thin film of nickel (Ni) or nickel-cobalt (Ni—Co) alloy which is electrically deposited on the exposed side and a gold (Au) or silver (Ag) thin film. The Ni or Ni—Co alloy thin film is 20–35 µm and the Au thin film is about 0.05–3 µm. The metallic layer 8c is composed of a Ni or Ni—Co thin film of Ni or N—Co alloy and a Su, Au or Ag thin film. The Ni or Ni—Co alloy thin film is about 5 µm. The Sn thin film is 3–15 µm. The Au or Ag thin film is about 0.3 µm.

Where the Ni or Ni—Co thin film is deposited after a metallic film with good solderbility such as Au or Au alloy has been deposited on the surface of a metallic substrate (described later), it is not necessary to form the metallic layer 8c.

It should be noted that the semiconductor device according to this invention is not directed to a package structure in-which a semiconductor element and other elements mounted on a glass epoxy or ceramic substrate are resin-sealed, but a structure in which the semiconductor element is housed in a resin package and the metallic film is exposed from the resin package.

Thus, since the semiconductor device which does not require the substrate on which the semiconductor element is mounted, its height is low. This permits the semiconductor device to be mounted on a printed board in balance.

Accordingly, the semiconductor device according to this invention has an advantage that the components are difficult to stand up when they are mounted in the printed board. Further, the semiconductor device can be mounted in the printed board in such a manner that the former is bonded to the printed board with the aid of adhesive applied to the bottom of the semiconductor device.

Figure 2A:
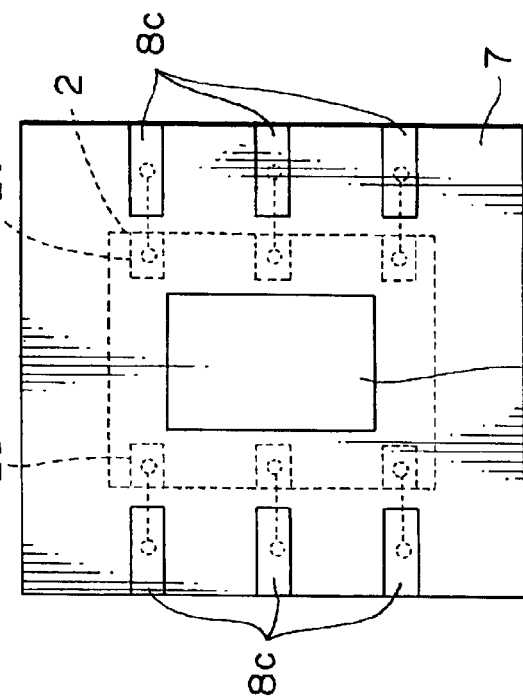
FIGS. 2A and 2B are a sectional view of an embodiment of the semiconductor device according to this invention and a bottom view thereof.
Figure 2B:
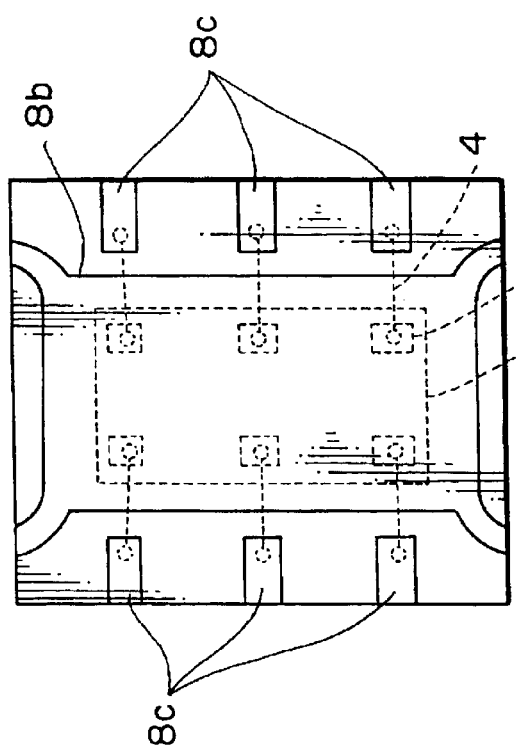

Referring to FIGS. 2A and 2B, an explanation will be given of the second embodiment of this invention.

FIGS. 2A and 2B are a sectional view of an embodiment of the semiconductor device according to this invention and a bottom view thereof. In the semiconductor device shown in FIG. 2, the metallic layer 8b is thicker than the metallic layer 8b of the semiconductor device shown in FIG. 1 and the area of the bottom of the semiconductor element 2 is larger than that of the metallic layer 8b. Therefore, the semiconductor element 2 is sealed in the resin package 7 at the height of about 20 μm or more from the bottom of the resin package 7.

Therefore, in the semiconductor device according to this invention, sufficient creepage distance is provided between the semiconductor element 2 and the bottom of the resin package 7. In addition, the semiconductor element 3 having a relatively large size can be resin-sealed.

Further, since the semiconductor device is resin-sealed so that resin is extended to the bottom of the semiconductor element 2, a sufficient creepage distance is provided so that the semiconductor device can have high moisture resistance.

Furthermore, a relatively large element can be resin-sealed in a small resin package.

The remaining structure of the semiconductor device in FIGS. 2A and 2B, which is the same as that of the semiconductor device shown in FIGS. 1A and 1B, is not described here.

Referring to FIGS. 3 to 6, an explanation will be given of an embodiment of a method of manufacturing a semiconductor device shown in FIG. 1. This manufacturing method is directed to a process in which a leadless surface-mounted semiconductor device is formed on a flexible planar metallic substrate and the metallic substrate is removed.

First, a flexible leadless planar metallic substrate 9 is prepared. The metallic substrate 9 is made of thin stainless steel and 0.1 mm thick. The metallic substrate 9 has holes 9a and 9b which are used for its automated transfer and holes which are used for its securing into a mold.

Figure 3A:
FIGS. 3A, 3B and 3C are a plan view of a metallic substrate, a plan view of a metallic substrate with a patterned metallic layer, and an enlarged cutaway plan view of the pattern metallic layer, respectively.
Figure 3B:
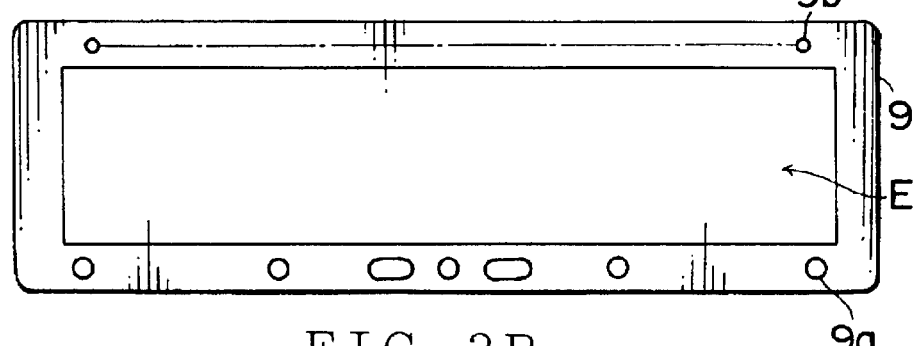

FIG. 3B shows an electrodeposition frame in which a pattern of a metallic layer on which a semiconductor element is mounted is formed. Within the electrodeposition frame, the semiconductor element 2 located on the one side of the metallic substrate 9 is resin-sealed so that a resin sealing body is formed on the one side of the metallic substrate.

Now referring to FIGS. 4 and 5, an explanation will be given of the first to eighth steps of a process for manufacturing a semiconductor device according to this invention.
1) The first step is to electro-deposit an metallic film on the entire surface on the one side of a metallic substrate 9 of e.g. stainless steel by electrodeposition. First, a photosensitive resist film is applied on the one surface of the metallic substrate by spin coating. The entire resist film thus applied is exposed to light so that it is hardened.

The metallic substrate 9 with a mask is immersed in an electrodeposition bath to form a metallic layer 8 on the other surface of the metallic substrate 9. The metallic layer 8 is a Ni or Ni—Co alloy thin film formed by electrodeposition. Thereafter, on the Ni or Ni—Co alloy thin film, gold is deposited by vacuum deposition by flush technique or sputtering.

Specifically, a current is passed between the metallic substrate 9 and an electrode within the electrodeposition bath so that the metallic layer 8 of the Ni or Ni—Co alloy thin film. The Ni or No—Co alloy thin film has a thickness of e.g. 20–35 μm, and the gold thin film has a thickness of 0.3 μm.

Incidentally, by vacuum-depositing an alloy containing gold on the metallic substrate 9 by the flush technique prior to electro-depositing the Ni or Ni—Co alloy film, the subsequent step of forming an electrode metallic layer can be omitted.
2) The second step is to etch the metallic layer 8. In this etching step, as seen from FIG. 4B, a mask of a resist film 10 is formed on the one side of the metallic substrate 9. Resist films 10a and 10b are selectively formed on the metallic layer 8 of the metallic substrate 9.

Figure 3C:
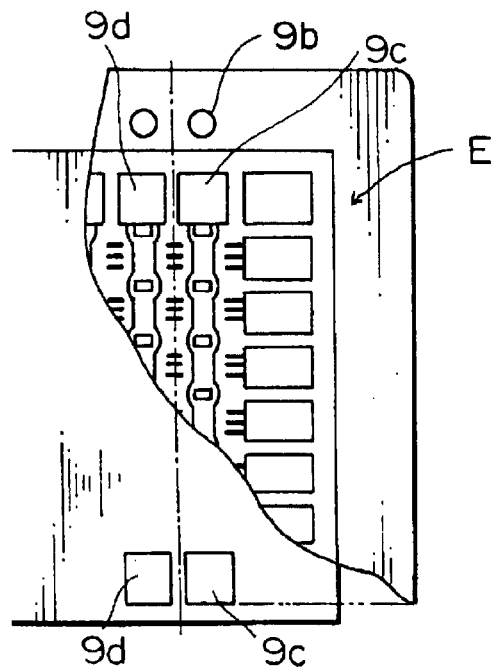
Figure 4A:
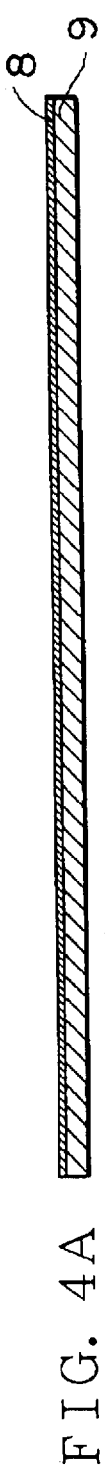
FIGS. 4A to 4E are sectional views showing respective steps of an embodiment of a method of manufacturing a semiconductor device according to this invention.
Figure 4B:
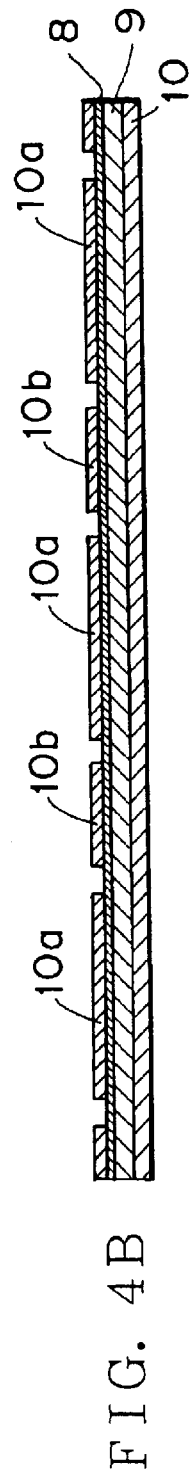
Figure 4C:
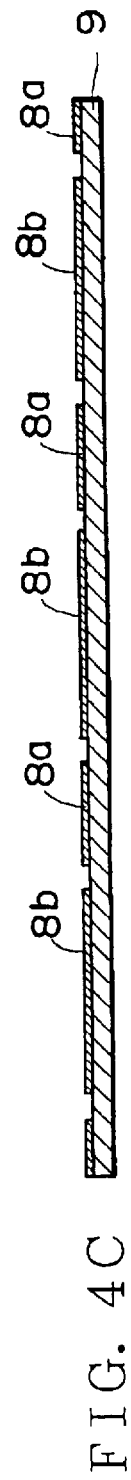
Figure 4D:
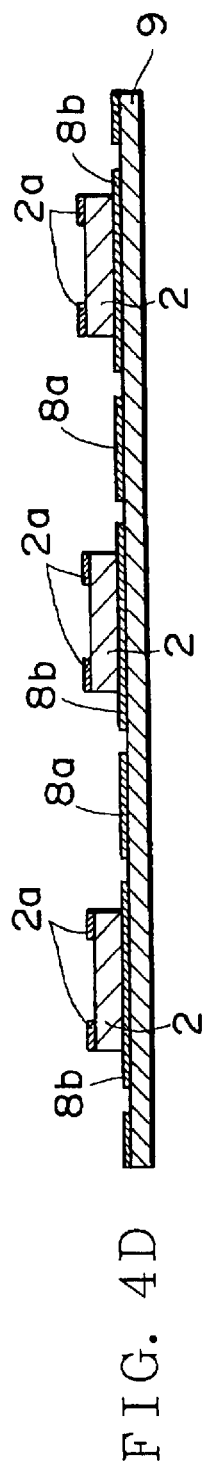

Thereafter, as seen from FIG. 4C, the metallic layer 8 is selectively etched away to form an electrodeposition frame with metallic layers 8a and 8b formed on the one side of the metallic substrate 9. As seen from FIG. 3B, the electrodeposition frame has an area E on which a semiconductor element is to be formed and a gold wire is to be wire-bonded thereto. On the area E, the metallic layers 8a and 8b are formed in a matrix shape. FIG. 3C shows a detailed pattern of the metallic layers.

Figure 4E:
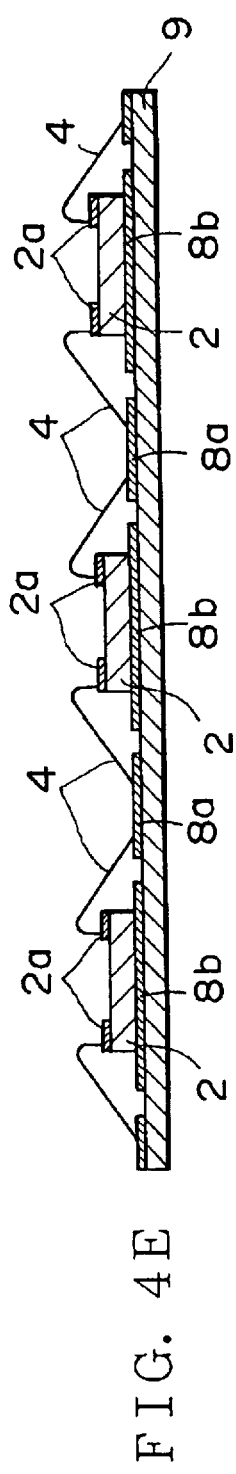

FIG. 3C shows the pattern of the wire-bonding area on the rear surface of a resin-sealed body (described later) when the metallic substrate is removed. This pattern has dicing marks 9d and 9c for cutting the body with a plurality of semiconductor elements resin-sealed into individual semiconductor device. In cutting, cutting lines are set between the dicing marks 9d and 9c.
3) The third step is to mount semiconductor elements. In this step, as seen from FIG. 4D, semiconductor elements 2 are mounted on the metallic layers 8b by a known technique. On the surface of each semiconductor element 2, as seen form FIG. 1, electrode pads 2a are formed.
4) After the semiconductor elements 2 have been mounted on the electrodeposition frame, the manufacturing process proceeds to a fourth step which is to wire-bond gold wires 4 to the semiconductor element 2. The wires 4 are electrically connected between the electrode pads 2a of the semiconductor element 2 and the metallic layers 8a by means of e.g. ultrasonic bonding.
5) The wire bonding step of FIG. 4E is succeeded by a fifth step which is resin-molding. The resin-molding step is to to mount the electrodeposition frame after the semiconductor elements 2 mounted on the metallic substrate 9 have been subjected to wire bonding in a molding die (upper die) or resin sealing body 11.

Epoxy resin is press-fit in the cavity (not shown) formed in the molding die. In this molding die, the metallic substrate 9 serves as a lower die.

A large number of electrodeposition frames on which the semiconductor elements are mounted are resin-sealed in such a manner that the metallic substrates on each of which the semiconductor elements are mounted are arranged in parallel, and the epoxy resin is press-fit into between the respective metallic substrates and the upper dies.

6) The resin molding step is succeeded by a sixth step which is to remove the metallic substrate as shown in FIG. 5B. As seen from FIG. 5B, the metallic substrate 9 is removed from the resin sealing body 11. The metallic substrate 9, which is a flexible plate, can be easily removed from the resin sealing body 11. The metallic layers 8a and 8b are exposed from the bottom of the resin sealing body 11. The exposed surfaces of the metallic layers 8a and 8b are flush with the bottom of the resin sealing body 11. Where the Ni or Ni—Co alloy thin film is exposed, the removing step is succeeded by a seventh step which is a dicing step.

7) The seventh step is to dice the resin sealing body shown in FIG. 5D along dicing lines S. The sealing body is cut out to provide the semiconductor elements. Specifically, the resin sealing body 11 is cut from the center line of each metallic layer 8a between the semiconductor elements 2 to provide individual semiconductor devices.

Figure 6A:
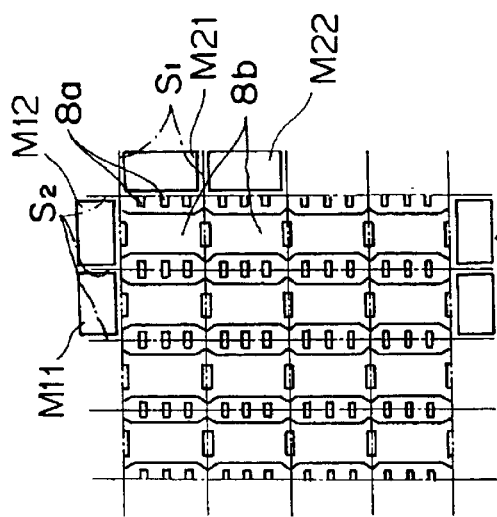
FIGS. 6A and 6B are a partially cutaway perspective view of a resin sealing body, and a bottom view of the resin sealing body, respectively.
Figure 6B:
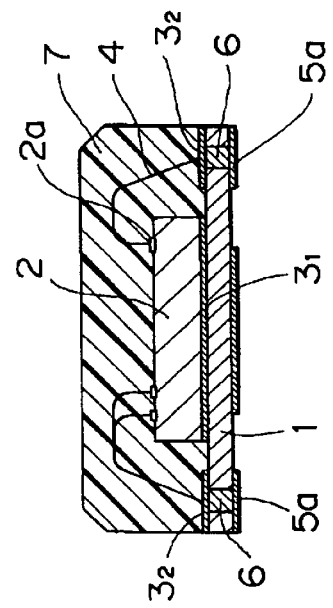

Now referring to FIGS. 6A and 6B, an explanation will be given of the dicing step which is the seventh step. FIG. 6A is a partially cutaway perspective view of a resin sealing body 11 with a large number of resin-sealed semiconductor devices. FIG. 6B is a bottom view of the resin sealing body.

In these figures, S1 and S2 denote dicing lines, respectively. The grooves 7a and 7b formed in the resin sealing body 11 are cut along the dicing lines S1 and S2 from the bottom of the metallic substrate 9 so that the resin sealing body 11 is divided into individual semiconductor devices.

As seen from FIG. 6B which is a bottom view of the resin sealing body 11, the electrode metallic layer 8a is cutout along the dicing line S2 between the dicing marks M11 and M12 so that the adjacent metallic layers 8a serve as the metallic layers for external extension.

The metallic layer 8b is cut out along the dicing line Si between dicing marks M21 and M22. Thus, the resin sealing body 11 is divided into the individual semiconductor devices in such a manner that it is cut along the dicing lines S1 and S2 in the dicing step.

The dicing step is succeeded by an eighth step of making an electrode.

8) In the eighth step, as seen from FIGS. 1 and 2, gold thin films 8c are applied to the metallic layers 8a and 8b at the bottom of the resin sealing body 2 of each of the individual semiconductor devices thus diced, respectively by means of the flush technique or electrolytic or non-electrolytic plating. Further, a Ni or Ni—Co alloy thin film is deposited electrically deposited on each of the gold layers to complete an external electrode.

The electrodeposition frame can be made not only by the technique described above but another technique. Namely, after the thin film of gold or a gold alloy on the metallic substrate has been made, it may be patterned and thereafter the thin film metallic thin film of Ni or Ni alloy may be electrically deposited thereon.

The thin film of gold or gold alloy on the metallic substrate is selectively deposited electrically on the metallic substrate 9 in such a state where a resist film deposited on the entire surface of the metallic substrate and patterned on the other surface thereof so that the surface of the metallic substrate corresponding to the areas where the semiconductor elements are to be mounted and the metallic layers are to be formed is exposed whereas the remaining area is covered with the resist film.

The patterned resist film is thereafter removed. A Ni or Ni—Co alloy film is formed on the entire surface on which the gold thin film has been formed. Thereafter, the Ni or Ni—Co alloy film is selectively removed.

Through such a manufacturing process, the metallic layers 8a and 8b are formed on the metallic substrate 9 as explained in connection with the above embodiment. The subsequent steps, which are the same as those described above, will not be explained here.

In the embodiment described above, the metallic substrate 9 is made of stainless steel having a thickness of 0.1 mm. However, this thickness should not be limited to this value. In this case, the metallic substrate is preferably removed from the resin sealing body with the semiconductor elements resin sealed.

In the conventional semiconductor device in which the metallic substrate is made of copper, the copper substrate must be removed by etching. However, the stainless steel substrate can be easily removed from the resin sealing body. For example, the stainless steel may be any one of SUS in the system of notation in the Japanese Industrial Standards.

Where the semiconductor device as shown in FIG. 2 is manufactured in which the metallic layer 8b on which the semiconductor element 2 is mounted is thicker than the metallic layer 8a, after the metallic layer 8a has been formed on the metallic substrate, with a resist mask for forming the metallic layer 8b, the metallic substrate is immersed for electrodeposition for the metallic layer 8b in a longer time than the time taken for electrodeposition of the metallic layer 8a. The subsequent steps have been described above.

Figure 7:
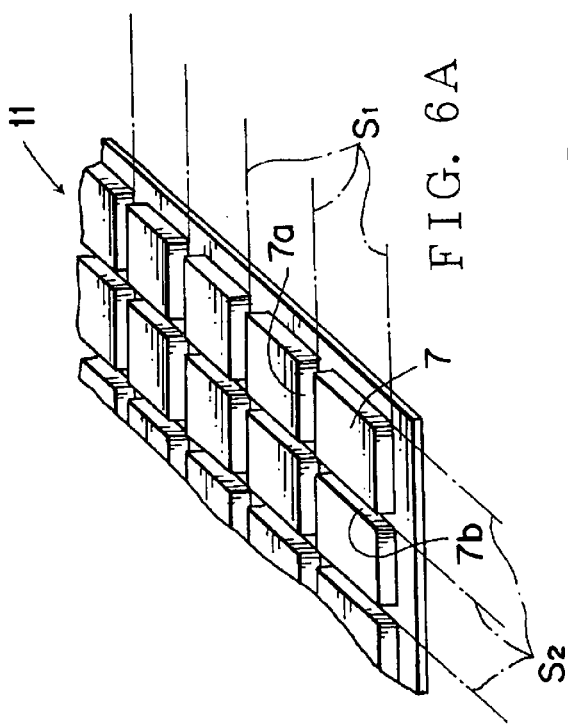
FIG. 7 is a bottom view of still another embodiment of a semiconductor device according to this invention.
Figure 8:
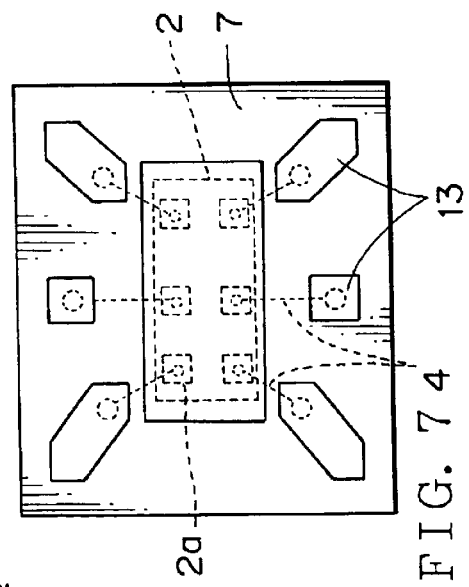
FIG. 8 is a sectional view of a conventional semiconductor device.

As seen from FIG. 7 which shows the bottom of the semiconductor device, the metallic layers 13 exposed from the resin package 7 have a flat surface, and the electrode pads 2a of the semiconductor element 2 sealed in the resin package 7 are electrically connected to the metallic layers 13 by means of wires 4.

As described above, in the semiconductor device according to this invention, the semiconductor elements are sealed in resin package so that the metallic layers for external extension are exposed from the bottom of the resin package. In addition, the bottom of the resin package is flush with that of the metallic layers for external extension. The Ni or Ni—Co alloy thin film and the Au thin film are formed on the metallic layers as external electrodes. The external electrodes protrude slightly from the bottom of the resin package. Thus, the semiconductor device can be mounted on a circuit board so that its bottom is in contact with the circuit board.

What is claimed is:

1. A method of manufacturing a semiconductor device comprising the steps of:

forming an electrodeposition frame on a flexible flat metallic substrate, said electrodeposition frame having first metallic layers and second metallic layers for external extension being patterned, wherein said first metallic layers are thicker than said second metallic layers;

contiguously mounting a plurality of semiconductor elements, each with electrode pads thereon, on said first metallic layers;

wire-bonding the electrode pads to said second metallic layers which are located between said semiconductor elements;

resin-sealing said semiconductor elements mounted on said electrodeposition frame;

removing said metallic substrate to provide a resin sealing body having a bottom so that rear surfaces of the first metallic layers and second metallic layers are flush with the bottom of said resin sealing body;

cutting said resin sealing body into individual semiconductor devices, wherein each device is provided with the first and second metallic layers; and depositing metallic thin films on portions of the first and second metallic layers that are exposed at the bottom said resin sealing body.

2. A method of manufacturing a semiconductor device according to claim 1, further comprising after the step of cutting, the step of:

depositing metallic layers for electrodes to the second metallic layers exposed from a rear surface of said resin sealing body.

3. A method of manufacturing a semiconductor device according to claim 1, wherein in said step of cutting of said resin sealing body, it is cut along a center line of each of the second metallic layers to provide metallic layers for external extension for adjacent semiconductor elements.

4. A method of manufacturing a semiconductor device according to claim 1, wherein said electrodeposition frame is resin sealed together with said semiconductor elements using said metallic substrate as a lower die.

* * * * *